United States Patent
Kossel et al.

(10) Patent No.: US 8,674,737 B1
(45) Date of Patent: Mar. 18, 2014

(54) CLOCK FEATHERED SLEW RATE CONTROL SYSTEM

(75) Inventors: Marcel A. Kossel, Rueschlikon (CH); Michael A. Sorna, Hopewell Junction, NY (US); Thomas H. Toifl, Zurich (CH); Glen A. Wiedemeier, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/606,940

(22) Filed: Sep. 7, 2012

(51) Int. Cl.
*H03K 5/12* (2006.01)

(52) U.S. Cl.
USPC .......................................................... 327/170

(58) Field of Classification Search
USPC ...................... 327/170, 108–112; 326/82–83; 365/233.13
See application file for complete search history.

(56) References Cited

U.S. PATENT DOCUMENTS

| | | | |
|---|---|---|---|
| 5,689,532 A * | 11/1997 | Fitzpatrick ..................... | 375/341 |
| 6,452,428 B1 | 9/2002 | Mooney et al. | |
| 6,744,287 B2 | 6/2004 | Mooney et al. | |
| 6,836,168 B1 | 12/2004 | Lesea et al. | |
| 7,339,364 B2 * | 3/2008 | Kam et al. ................. | 324/76.54 |
| 7,626,423 B1 | 12/2009 | Li et al. | |
| 7,777,538 B2 | 8/2010 | Abel et al. | |
| 8,115,508 B2 | 2/2012 | Bucossi et al. | |
| 2007/0230646 A1* | 10/2007 | Talbot et al. .................. | 375/355 |
| 2008/0164924 A1* | 7/2008 | Bucossi et al. ................ | 327/170 |

FOREIGN PATENT DOCUMENTS

JP  2007097136 A  4/2007

OTHER PUBLICATIONS

Kim, et al.; "A DLL With Jitter Reduction Techniques and Quadrature Phase Generation for DRAM Interfaces"; IEEE Journal of Solid-State Circuits; pp. 1522-1530; May 2009 (Abstract Only).
Cheng, et al.; "A .077 PS RMS Jitter 6-Ghz Spread-Spectrum Clock Generation Using a Compensated Phase-Rotating Technique"; IEEE Journal of Solid-State Circuits; pp. 1198-1213; May 2011 (Abstract Only).
Goto, et al.: "CMOS Programmable Delay Vernier", Hewlett Packard Journal, Oct. 1994, pp. 1-8.

* cited by examiner

*Primary Examiner* — Lincoln Donovan
*Assistant Examiner* — Thomas Skibinski
(74) *Attorney, Agent, or Firm* — Cantor Colburn LLP; Daniel Morris

(57) ABSTRACT

A slew rate control circuit configured to control a slew rate of driver circuit comprises a clock delay module that receives a half-rate clock signal and that includes a plurality of delay cells configured to generate a plurality of respective delayed clock signals each having a different time delay from one another. A driver module includes a plurality of multiplexers in electrical communication with a respective data cell to receive a corresponding delayed clock signal. The multiplexers are configured to output a respective full-rate data stream in response to the delayed clock signal. The slew driver module further includes an output stage circuit in electrical communication with each multiplexer to combine each full-rate data stream and to generate a final step-wise driving signal that controls the slew rate.

11 Claims, 6 Drawing Sheets

CLOCK FEATHERED SLEW RATE CONTROL SYSTEM

BACKGROUND

The present disclosure relates generally to a slew rate control system, and more specifically, to a slew rate control system based on feathered clock signals.

Slew rate is an important specification in double data rate (DDR) synchronous dynamic random access memory (SDRAM) devices. In particular, the adjustment and control of the slew rate can increase signal integrity and mitigate undesirable crosstalk effects at memory links between the memory controller and the dual in-line memory module (DIMM) of the DDR SDRAM.

Conventional schemes for controlling the slew rate are based on a full-rate architecture scheme. The full-rate architecture scheme utilizes a full-rate clock signal along with a plurality of delay lines to generate a delay signal that delays the output edges of the data signal transmitted on the data lines. The use of a full-rate clock signal, however, requires the need to re-time each individual delay line. Consequently, the full-rate architecture scheme increases the components required to control the slew rate and causes timing uncertainty at the driver output.

SUMMARY

According to at least one embodiment of the disclosure, a slew rate control circuit configured to control a slew rate of driver circuit comprises a clock delay module that receives a half-rate clock signal. The slew rate control circuit further includes a plurality of delay cells configured to generate a plurality of respective delayed clock signals each having a different time delay from one another. The slew rate control signal further includes a driver module having a plurality of multiplexers each being in electrical communication with a respective data cell to receive a corresponding delayed clock signal. The multiplexers are configured to output a respective full-rate data stream in response to the delayed clock signal. The driver module further includes an output stage circuit in electrical communication with each multiplexer to combine each full-rate data stream and to generate a final step-wise driving signal that controls the slew rate.

According to another embodiment of the disclosure, a clock feathering delay module comprises a clock input configured to receive a half-rate clock signal, and a plurality of delay cells configured to generate a plurality of respective delayed clock signals based on the half-rate clock signal. Each clock signal among the plurality of delayed clock signals have a different time delay from one another.

In yet another embodiment of the disclosure, a data re-timing module comprises a half-rate data re-timing module configured to receive at least one data stream and a half-rate clock signal, and to output a delayed at least one data stream. The data re-timing module further includes a data resampling module configured to receive the delayed at least one data stream and a delayed clock signal different from the half-rate clock signal. The data resampling module extends the timing of the delayed at least one data stream based on the delayed clock signal.

In still another embodiment of the disclosure, a method of controlling a slew rate of a data signal comprises generating a plurality of delayed clock signals each having a different time delay from one another based on a half-rate clock signal. The method further includes generating a plurality of full-rate data streams based on first and second input data streams and at least one of delayed clock signal among the plurality of delayed clock signals. The method further includes generating a final step-wise driving signal that controls the slew rate based on the plurality of full-rate data streams.

Additional features and utilities are realized through the teachings of the present disclosure. Other embodiments and features are described in detail herein and are considered a part of the claimed inventive concept. For a better understanding of the claimed features, refer to the provided description and drawings.

BRIEF DESCRIPTION OF THE SEVERAL VIEWS OF THE DRAWINGS

The subject matter of various embodiments of the disclosure is particularly pointed out and distinctly claimed in the claims at the conclusion of the specification. The forgoing and other features, and utilities of the claimed embodiments are apparent from the following detailed description taken in conjunction with the accompanying drawings in which:

DETAILED DESCRIPTION

Figure 1:
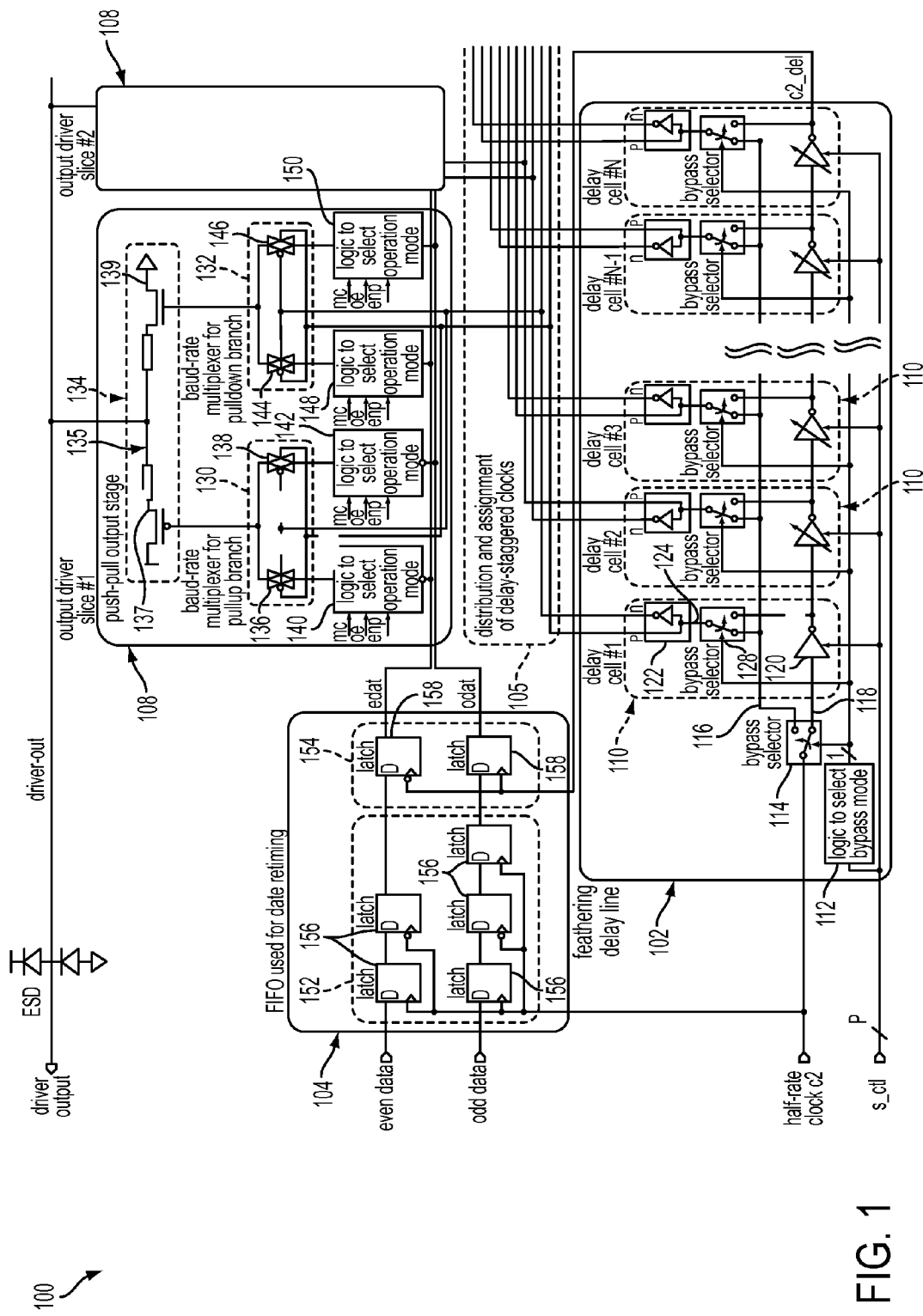
FIG. 1 is a schematic of a slew rate control circuit configured to control a slew rate of a driver circuit according to at least one embodiment of the present disclosure.

With reference now to FIG. 1, a schematic of a slew rate control circuit 100 to control a slew rate of driver circuit is illustrated according to at least one embodiment of the present disclosure. The slew rate associated with memory links are typically based on parameters set by industry standards, such as the Joint Electron Devices Engineering Council (JEDEC) standards on DDR SDRAM Specifications (JESD79). According to the standards, a slew rate may be based on the signaling delivered through a 25-ohm load resistor connected to Vddr/2, where Vddr is the supply voltage. The high and low voltage thresholds may be 60% of Vddr and 40% of Vddr, respectively. For a driver having an impedance level of (R), the swing across the slew rate load may be determined as $$Vsw = \frac{2500}{100R + 2500} Vddr \qquad (1)$$

To calculate the rise/fall times that belong to the threshold levels 0.4×Vddr and 0.6×Vddr, the following two equations may be solved for Δt=t2−t1:

$$\frac{\frac{V_{SW}}{2} - \frac{Vddr}{10}}{V_{SW}} = 1 - e^{-\frac{t1}{\tau}}, \quad (2)$$

$$\frac{\frac{V_{SW}}{2} + \frac{Vddr}{10}}{V_{SW}} = 1 - e^{-\frac{t2}{\tau}}, \quad (3)$$

which yields:

$$\Delta t = \tau \ln\left(\frac{150 + R}{100 - R}\right) \quad (4)$$

Accordingly, the final expression for the slew rate as a function of the output capacitance (C) and the driver impedance level (R) may be determined as $$sr = \frac{0.2Vddr}{\Delta t} = \frac{0.2Vddr}{RC\ln\left(\frac{150 + R}{100 - R}\right)} \quad (5)$$

The slew rate control circuit 100 is configured to control the slew rate realized at a memory link between a memory controller (not shown) and a DIMM (not shown) by staggering, i.e., feathering, a half-rate clock signal to output delayed time signals having different phases, i.e., time delays, to individual driver modules. The slew rate control circuit 100 receives at least one data stream, such as even and odd data streams. The even and odd data streams may be converted into staggered full-rate data streams that are ultimately used to generate a final output driving signal that controls the slew rate. Accordingly, the impedance level (R) in equation (5) above may be varied according to time as the individual driver modules are successively enabled according to the different time delayed signals. Hence, the output edge of the final output driving signal is increased in a delay-staggered manner, thereby controlling the slew rate. In at least one embodiment of the disclosure, the slew rate may be controlled in a range from about 3 volts/nanoseconds (V/ns) to about 7 volts/nanoseconds (V/ns). However, the slew rate control range provided by the slew rate control circuit 100 is not limited thereto.

The slew rate control circuit 100 illustrated in FIG. 1 includes a clock feathering delay module 102, a data re-timing module 104, a phase distribution network 105, and a driver module 108. The slew rate control circuit 100 receives a half-rate clock signal (c2) from a clock generator, such as a phase lock loop (PLL) circuit (not shown). The half-rate clock signal (c2) is commonly input to the clock feathering delay module 102 and the data re-timing module 104.

The clock feathering delay module 102 may include one or more delay cells 110, a bypass switch selector 112, and a bypass switch 114. The bypass switch selector 112 relays a select signal (s_ctl) output from a memory controller (not shown) of the DDR SDRAM device for selecting a bypass mode or a delay mode. The bypass switch 114 selects first and second clock paths 116, 118 in response to the select signal (s_ctl). For example, the bypass switch 114 may select the first path 116 for bypassing the one or more delays cells 110 in response to setting the s_ctl to a logic low value, e.g., a logic 0. Accordingly, the half-rate clock signal (c2) is delivered to the phase distribution network 105 without being delayed by the clock feathering delay module 112. Alternatively, the bypass switch 114 may select the second path 118 for delivering the half-rate clock signal (c2) to the one or more delays cells 110 in response to setting the s_ctl to a logic high value, e.g., a logic 1. Therefore, one or more time delayed signals corresponding to the half-rate clock signal are generated, as discussed in greater detail below. When operating in the bypass mode the slew rate of the transmitter output signal becomes fastest, but slew rate adjustment may become more difficult.

Each delay cell 110 includes a delay element 120 connected to a differential converter 122 via a signal path 124. The delay element 120 may comprise, for example, an inverter. Further the inverter may include a fixed inverter or a variable inverter. The inverters may be implemented as a CMOS inverter.

Figure 3:
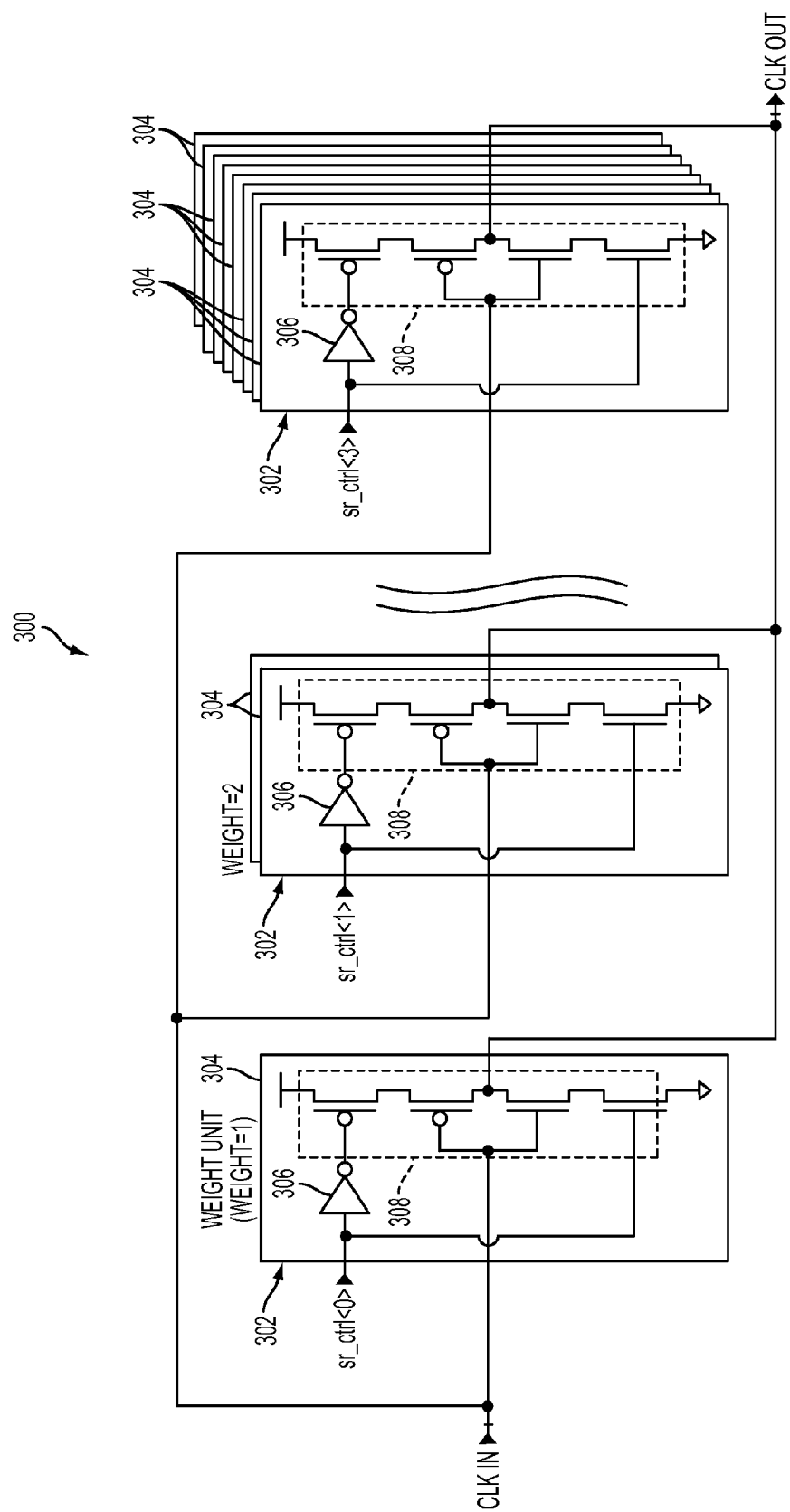
FIG. 3 is a schematic of a data re-timing module illustrated in the slew rate control circuit of FIG. 1 according to at least one embodiment of the present disclosure.

The delay cells 110 may further include an enable switch 128 disposed between the delay element 120 and the differential converter 122 to enable the delay path 124 such that the corresponding delay cell 110 may be tapped. More specifically, when an enable switch 128 enables a respective delay path 124, the corresponding delay cell 110 delays the half-rate clock signal (c2) via the delay element 120. Alternatively, if the enable switch 128 disables the delay path 124, the respective delay cell 110 is bypassed and the corresponding delay is not applied to the half-rate clock signal. In at least one embodiment of the disclosure, the clock feathering delay module 102 comprises a plurality of binary-weighted delay cells 110, as illustrated in FIG. 3 and discussed further below.

In the clock feather delay module 102, a correlation exists between voltages of the slewed driver edges and the number of delay cells 110 required to delay the half-rate clock signal. Typically, slewed driver edges having a small voltage increment requires a large number of delay cells 110. Two measures may be taken to address the aforementioned correlation. First, the clock feathering delay module 102 may be bypassed completely via the bypass switch 114 as discussed above. Accordingly, the minimum delay is ideally zero such that the clock feather delay module 102 essentially receives the real time phase of the half-rate clock signal (c2). Thus, the slew rate is determined by only the output pole of the driving module 108 to achieve the fastest slew rate.

A second measure utilizes binary weighted delay cells 110 including inverting delay elements, i.e., inverters, as the delay elements 120. An embodiment of the disclosure implementing binary weighted delay cells 110 is illustrated in FIG. 3 and discussed in greater detail below. To reduce misalignment of the delay outputs of the respective delay elements 120, the inverted outputs of the inverting delay elements 120 are phase twisted via the differential converter 122.

The slew rate control circuit 100 includes one or more driver modules 108. The driver module 108 receives at least one data stream, such as even and odd data streams, along with the outputs from the delay cells 110. Based on the even and odd data streams and the outputs from the delay cells 110, the driver module 108 generates one or more full-rate data streams. The full-rate data streams are then combined to generate a staggered final output driving signal (driver_out) that is output to a dual in-line memory module (DIMM) of a DDR SDRAM device. In at least one embodiment of the disclosure, a plurality of driver modules 108 are connected in parallel with one another to provide different full-rate data streams such that the impedance of each driver module 108 may be adjusted.

The driver modules 108 comprise a pull-up baud-rate multiplexer (UMUX) 130, a pull-down baud-rate multiplexer (DMUX) 132, and an output stage circuit 134. The output stage circuit 134 may include, for example, a push-pull circuit 135. The multiplexers 130, 132 may split the full-rate data streams into two streams that are input to the push-pull circuit 135. This split is implemented by two pairs of parallel baud-rate multiplexers that define the UMUX 130 and DMUX 132.

More specifically, the UMUX 130 includes first and second multiplexing elements 136, 138 and corresponding first and second mode selectors 140, 142. A first end of the multiplexing elements 136, 138 is connected to a pull-up circuit 137 of the driver module 108. A second end of the first multiplexing element 136 is connected to a corresponding first mode selector 140, whereas a second end of the second multiplexing element 138 is connected to a corresponding second mode selector 142. Similarly, the DMUX 132 includes first and second multiplexing elements 144, 146 and corresponding first and second mode selectors 148, 150. A first end of the multiplexing elements 144, 146 is connected to a pull-down circuit 139 of the driver module 108. A second end of the first multiplexing element 144 is connected to a corresponding first mode selector 148, whereas a second end of the second multiplexing element 146 is connected to a corresponding second mode selector 150.

The first mode selectors 140, 148 receive the even data stream, and the second mode selectors 142, 150 receive the odd data stream. The mode selectors 140, 142, 148, 150 process the even and odd data streams according to various operation modes before relaying them to the corresponding multiplexing elements 136, 138, 144, 146. More specifically, the mode selectors 140, 142, 148, 150 provide four different operation modes: (1) Drive Mode, (2) On-die termination Mode, (3) Calibration Mode, and (4) High impedance Mode. When operating in the Drive Mode, the pull-up and pull-down circuits of the driver module 108 are operated according to the multiplexed even and odd data streams. For example, when a logic 1 occurs the pull-up circuit is enabled and the pull-down circuit is disabled (vice versa for a logic 0). While operating in the On-die termination Mode, both the pull-up and pull-down circuits are enabled regardless as to the values of the even and odd data streams. When operating in the Calibration Mode, the pull-up and pull-down circuits may be turned on or off separately. When operating in the High impedance Mode, both the pull-up and pull-down circuits are disabled regardless as to the values of the even and odd data streams. Further, the High impedance Mode allows the disablement of individual driver cells 110 to provide a coarse adjustment of the output impedance of the driver module 108.

The UMUX 130 and DMUX 132 each receive the even and odd data streams from respective mode selectors 140, 142, 148, and 150. The data streams are then converted into full-rate data streams, which ultimately drive the corresponding output stage circuit 134 according to the mode selected by the mode selectors 140, 142, 148, 150. Accordingly, the driver modules 108 are capable of handling high-termination signaling that is desirable for use in DDR4 applications.

Figure 2:
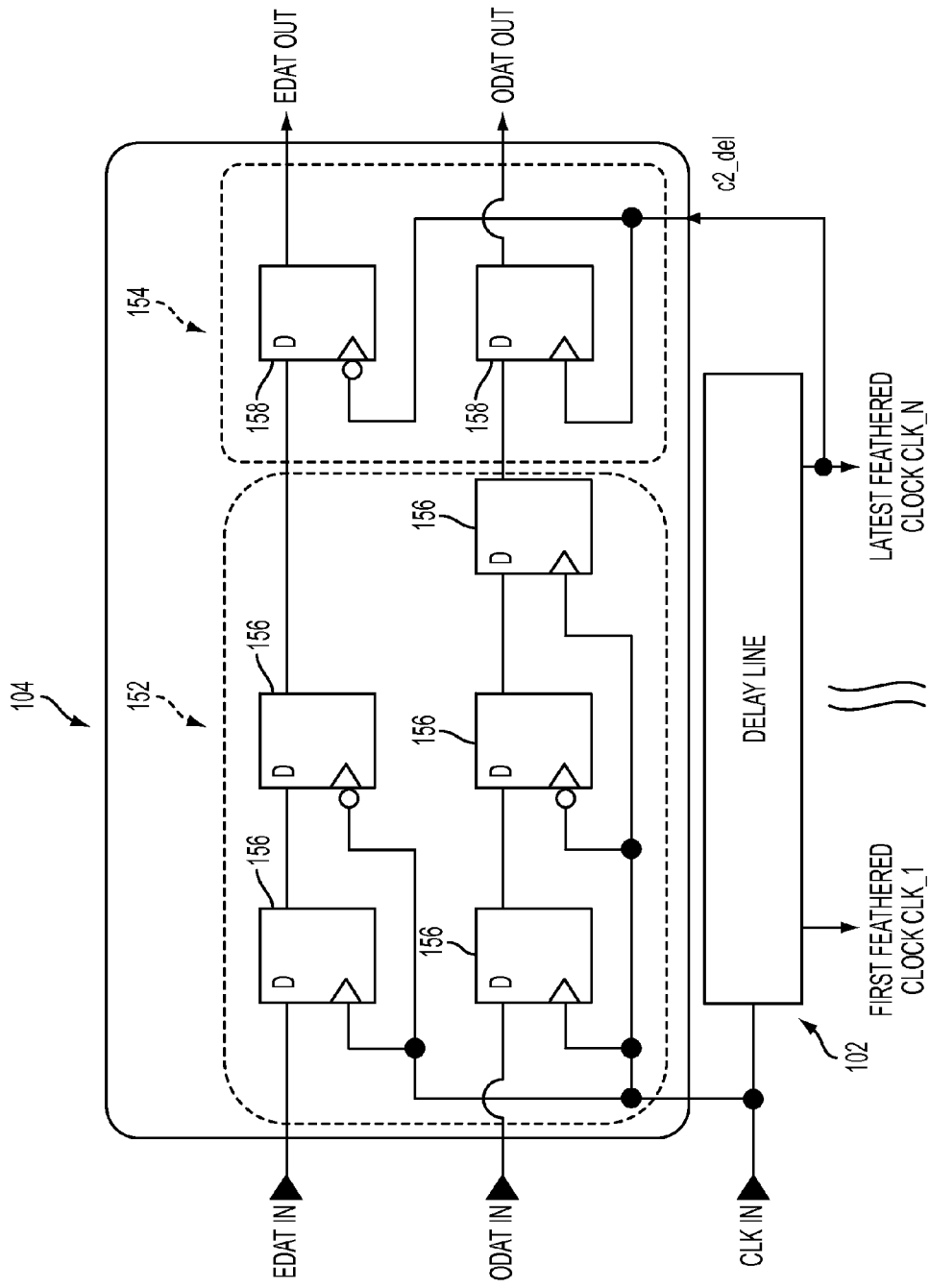
FIG. 2 is a schematic of a delay module included in the slew rate control circuit of FIG. 1 according to at least one embodiment of the present disclosure.

The data re-timing module 104 is disposed upstream from the diver module 108, and may be configured as a first-in first-out (FIFO) re-timing module to re-time the even and odd data streams separately from the half-rate clock signal. An enlarged view of the data re-timing module 104 is illustrated in FIG. 2. In at least one embodiment of the disclosure, the data re-timing module 104 comprises a half-rate data re-timing module 152 and a data resampling module 154. The half-rate data re-timing module 152 includes a plurality of timing latches 156, which are driven by the half-rate clock signal. A first plurality of timing latches 156 re-times the even data stream to output a re-timed even data stream. The first plurality of timing latches 156 may alternate between inverted and non-inverted latches. A second plurality of timing latches 156 re-times the odd data stream to output a re-timed odd data stream. The second plurality of timing latches 156 may also alternate between inverted and non-inverted latches.

The data resampling module 154 includes a plurality of resampling latches 158 configured to resample, i.e., extend the time of the re-timed data streams generated by the re-timing module 152. A first resampling latch 158 extends the timing of the re-timed even data stream, and a second resampling latch 158 extends the timing of the re-timed odd data stream. The first resampling latch 158 may be inverted with respect to the second resampling latch 158. Unlike the timing latches 156, however, the resampling latches 158 are driven by a delayed clock signal output from the clock feathering delay module 102. In at least one embodiment illustrated in FIG. 2, the data resampling module 154 receives the delayed clock signal having the greatest delay among the delayed clock signals. Accordingly, the resampling latches 158 are driven by the latest delayed clock signal (c2_del) to extend the even and odd data streams output from the half-rate re-timing module 152 prior to being converted into full-rate data streams by the driving module 108. By extending the timing of the even and odd data streams using the latest delayed clock signal (c2_del), data hold violations at the UMUX 130 and DMUX 132 of the driving module 108 may be prevented since the edge transitions of the input data streams occur after the transition of latest delayed clock signal (c2_del). For example, edges of odd data stream transition during the even half-cycle and vice versa for the even data stream, regardless of the total delay range provided by the clock feather delay module 102.

Accordingly, at least one embodiment of the disclosure described above provides a clock feathering delay module 102 that receives a half-rate clock signal, and provides different delay taps that output different delayed clock signals based on the half-rate clock signal. Further, the data re-timing module 104 re-times the even and odd input data streams separately from the half-rate clock signal (c2). Therefore, a driver module 108 receives even and odd re-timed data streams, along with the different delayed clock signals to generate full-rate data streams used to generate a step-wise final output driving signal that controls the slew rate realized at the memory link between the memory controller and the DIMM of the DDR SDRAM. Moreover, the number (n) of delay cells 110 and the number (m) of driver modules 108 may be selected independently from the data re-timing module 104. As a result, less components are used for controlling the slew rate.

Referring now to FIG. 3, a clock feathering delay module 300 is illustrated according to an embodiment of the disclosure. The clock feather delay module 300 includes one or more delay cells 302. Each data cell 302 comprises one or more delay stages 304. The delay stage 304 includes a stage enabling element 306 and a delay element 308. A select signal (s_ctl) may be output from a memory controller (not shown) of a DDR SDRAM device to the enabling element 306 to enable one or more corresponding delay stages 304. The select signal (s_ctl) may be a binary signal having a predetermined binary value, as discussed in greater detail below. In response to enabling the delay stage 304, one or more delay elements 308 of a corresponding delay cell 302 delay the half-rate clock signal (c2) by a corresponding unit of delay.

The unit of delay for each delay cell 302 may be determined according to the total delay range of the clock feather delay module 300 and the total number of delay cells 302 included in the clock feather delay module 300. In at least one embodiment illustrated in FIG. 3, the clock feather delay module 300 has a total delay ranging from about 70 picoseconds (ps) to about 200 picoseconds (ps), and a total of six delay cells 302. Accordingly, the unit of delay for each delay cell 302 may range from about 11.67 picoseconds (ps) to about 33.33 picoseconds (ps).

The clock feathering delay module 300 may be controlled in various ways including, but not limited to, adjusting the tail current source weights of current-starved inverters and connecting the delay elements 106 in parallel with one another. However, delaying the half-rate clock signal (c2) as discussed above may have an inverse relationship on the switching current. Therefore, a clock feathering delay module 300 according to at least one embodiment of the disclosure applies a binary weighted delay scheme to compensate for the nonlinear relationship between delay output and the switching current, thereby linearizing the delay outputs of the individual delay cells 302.

Referring again to FIG. 3, the delay cells 302 are illustrated as having an assigned weight unit, i.e., weight. Each weight may be represented by a binary value, i.e., a binary weight. The binary weight of each delay cell 302 is determined according to $2^{n-1}$, where "n" is the indicated delay cell 302 (e.g., the first delay cell, the second delay cell, the third delay cell, etc.) For example, the first delay cell 302 having a weight=1 has a binary weight of $2^0$, the second delay cell 302 having a weight=2 has a binary weight of $2^1$, the third delay cell 302 having a weight=4 has a binary weight of $2^2$, the fourth delay cell 302 having a weight=8 has a binary weight of $2^3$, and so on. Accordingly, each delay stage 304 may be represented by a binary value of the s_ctl signal, and may delay the half-rate clock signal (c2) according to the weight (1, 2, 4, 8, etc.) of the delay cell 302. The delay of a delay cell 302 is inverse proportional to the number of enabled weights 304. If all weights 304 are enabled, the delay is at a minimum (e.g., 70 ps). If only one weight is enabled, the delay is at a maximum (e.g., 200 ps). Despite the binary weighting the delay profile is nonlinear. To linearize the delay profile one must deviate from a strictly binary weighting and choose the individual weights such that they become inverse proportional to the nonlinear delay profile. This may be implemented using, for example, a thermometer or linear code instead of a binary code. Accordingly, a nonlinear relationship between delay output and the switching current may be compensated, while still linearizing the delay outputs of the clock feathering delay module 300.

Figure 4:
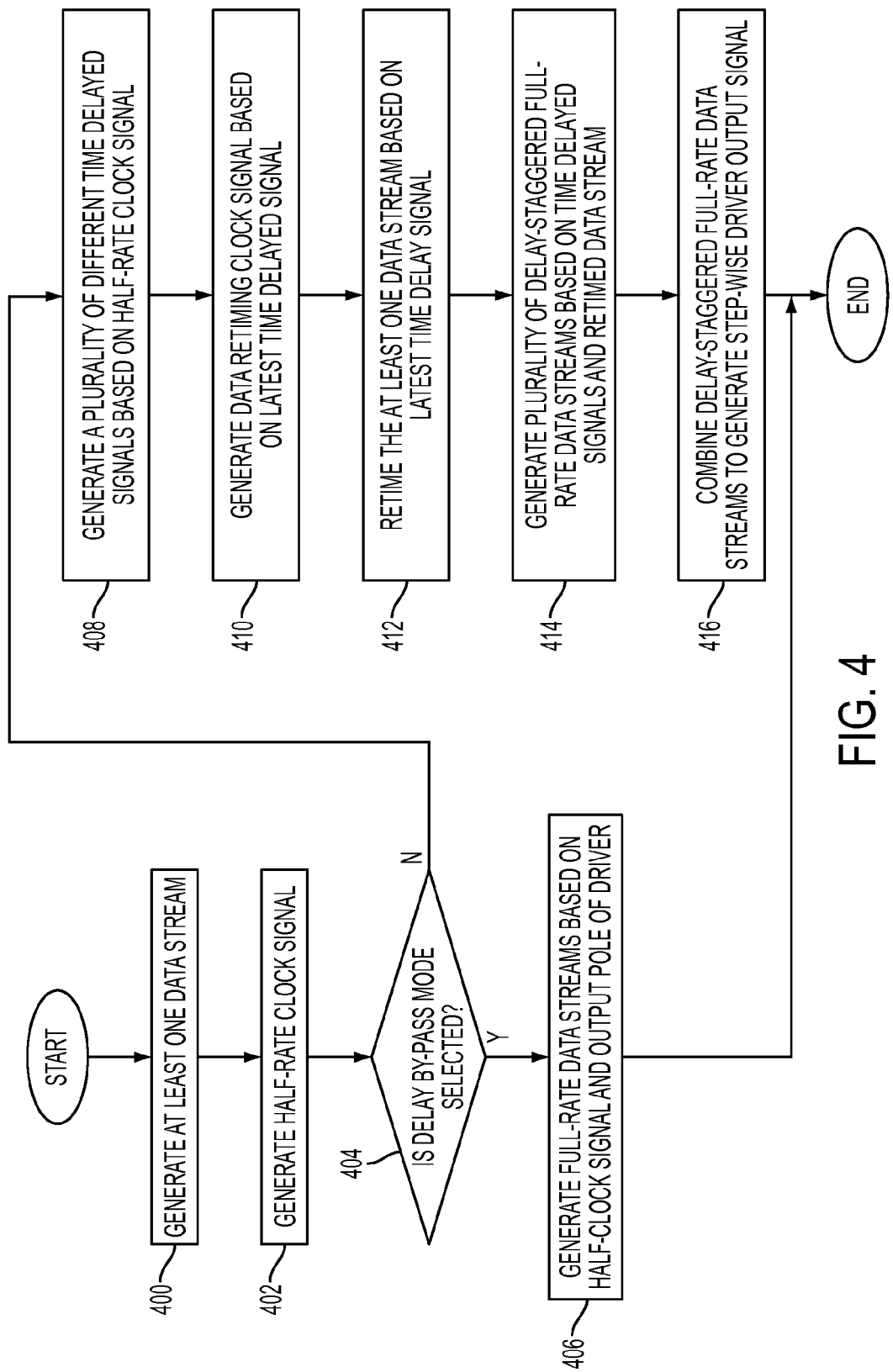
FIG. 4 is a flow diagram illustrating a method of controlling a slew rate according to an embodiment of the present disclosure.

Referring now to FIG. 4, a flow diagram illustrates a method of controlling a slew rate according to an embodiment of the present disclosure. At operation 400, at least one data stream is generated. For example, even and odd data streams may be generated and converted into full-rate data streams for controlling the slew rate. A half-rate clock signal is generated at operation 402. The half-rate clock signal may be used to drive a feathering clock delay module, which may be tapped to provide a plurality of delay signals having different time delays. At operation 404, a determination as to whether a by-pass mode is selected. If the by-pass mode is selected, full-rate data streams are generated based on the actual half-rate clock signal and the output pole of a slew rate output driver at operation 406. Accordingly, the minimum delay of the half-rate clock signal is essentially zero, thereby providing the fastest slew rate, and the method ends.

However, if the by-pass mode is not selected at operation 404, a plurality of different time delayed signals are generated based on the half-rate clock signal at operation 408. In at least one embodiment, each time delayed signal has a different time delay with respect to one another. At operation 408, a data re-timing clock signal is generated based on at least one of the time delayed signals. In at least one embodiment of the disclosure, the data re-timing clock signal is the time delayed signal having the greatest time delay among the generated time delayed signals. At operation 412, the at least one data stream is re-timed based on the data re-timing clock signal. For example, the timing of even and odd input data streams may be extended to reduce the chance of setup and/or hold violations of the full-rate data streams. At operation 414, a plurality of delay-staggered full-rate data streams may be generated based on the at least one of the time delayed signals and the at least one re-timed data stream. The delay-staggered full-rate data streams are combined at operation 416 to generate a step-wise driver signal that controls the slew rate, and the method ends.

Figure 5:
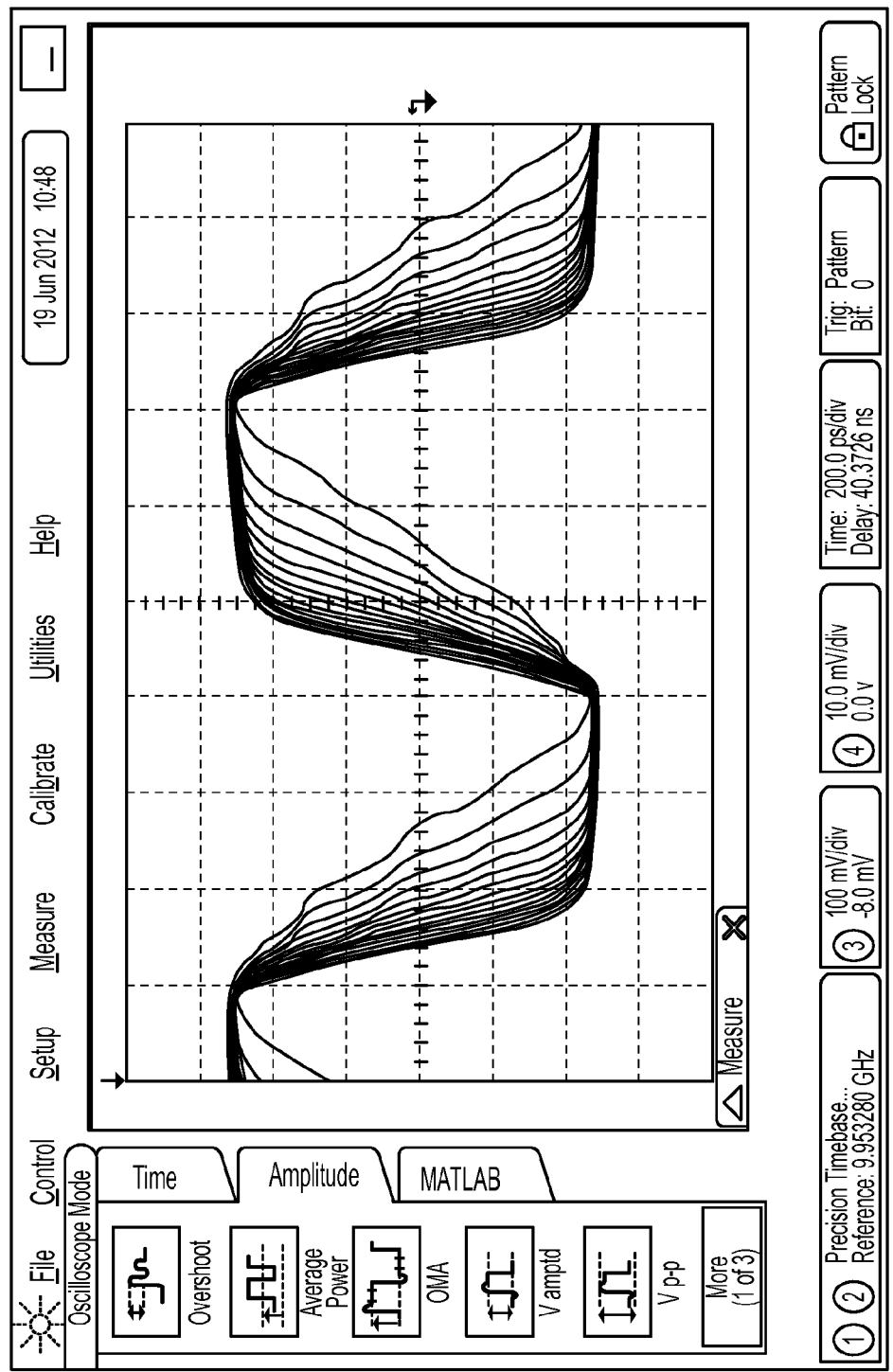
FIG. 5 illustrates a slew-rate sweep diagram resulting from a slew rate control circuit according to at least one embodiment of the present disclosure.

Referring to FIG. 5, a slew-rate sweep diagram illustrates results of a slew rate control circuit according to at least one embodiment of the present disclosure. The diagram overlays sixteen different slew rate settings resulting from a slew rate control circuit operating at 1600 Mb/s and a 24Ω driver impedance. As shown, the slew-rate may be controlled as additional delay stages included in the clock feathering delay modules are activated, as indicated by the slew rate code, i.e., code 1-16.

Figure 6:
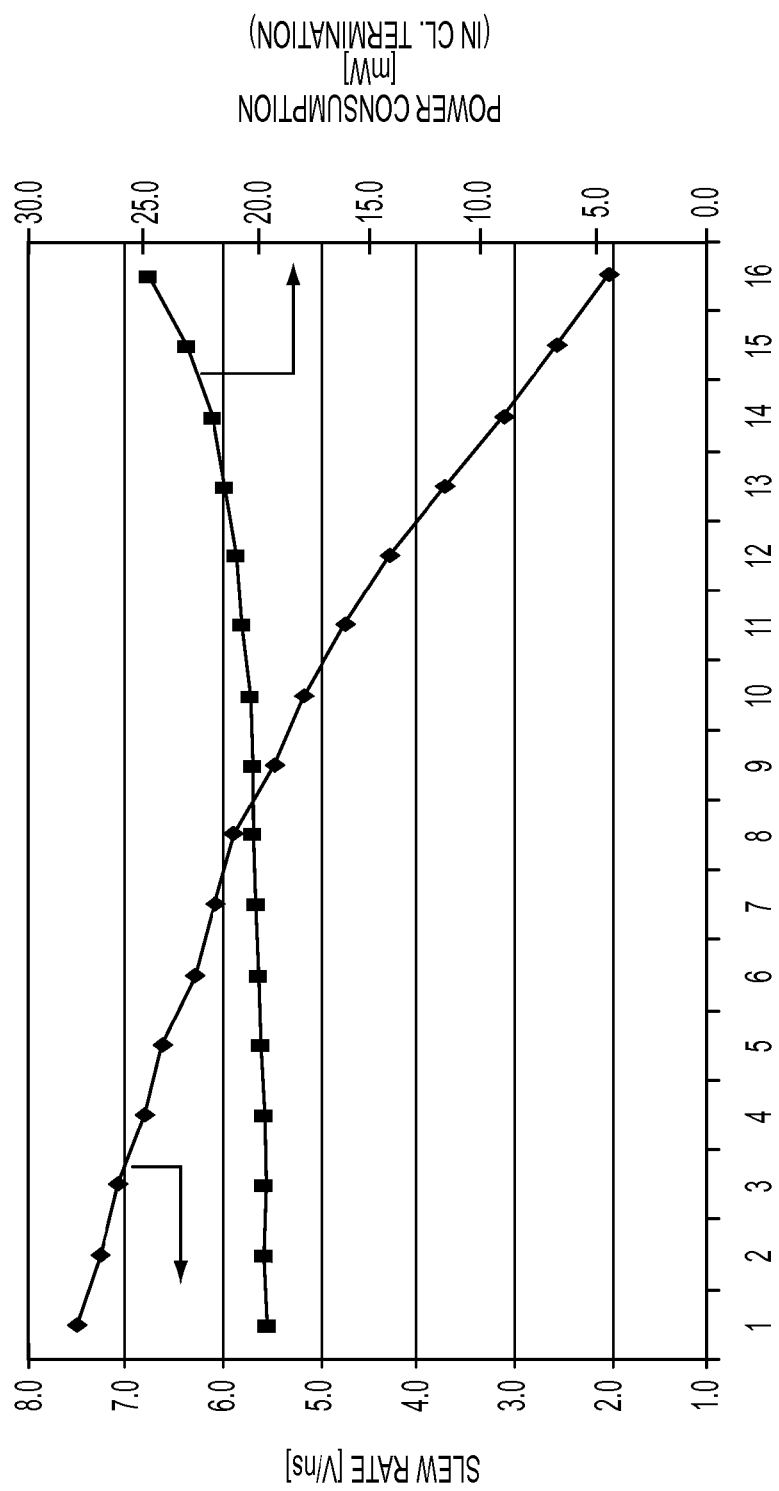
FIG. 6 is a graph diagram illustrating a relationship between slew rate and power consumption of a slew rate control circuit according to at least one embodiment of the present disclosure.

Referring now to FIG. 6, a graph diagram illustrates a relationship between the slew rate and power consumption of a slew rate control circuit according to at least one embodiment of the present disclosure. More specifically, FIG. 6 illustrates the relationship between the slew rate and power consumption as various delay stages of a clock feathering delay module are activated, as indicated by the slew rate codes 1-16 displayed along the X-axis of the graph. In the case of FIG. 6, the results are obtained from a slew rate control circuit operating at 1600 Mb/s, 24Ω driver impedance, 50Ω load impedance and 1.5V dc power supply. Accordingly, the graph illustrates that the slew rate decreases from about 8 V/ns to about 2.0 V/ns when the slew rate code increases from 1 to 16 because the number of enabled weights within the individual delay cells decrease and hence their delay increases. The power consumption increases for smaller slew rates because of the increased crowbar current associated with the smaller edge steepness.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, operations, elements, and/or components, but do not preclude the presence or addition of one more other features, integers, operations, element components, and/or groups thereof.

The flow diagrams depicted herein are just one example. There may be many variations to this diagram or the operations described therein without departing from the spirit of the invention. For instance, the operations may be performed in a differing order or operations may be added, deleted or modified. All of these variations are considered a part of the claimed invention.

While various embodiments of the disclosure have been described, it will be understood that those skilled in the art, both now and in the future, may make modifications to the embodiments that fall within the scope of the claims which follow. These claims should be construed to maintain the proper protection for the inventive concept first described.

The invention claimed is:

1. A slew rate control circuit configured to control a slew rate of driver circuit, comprising:
   a clock delay module that receives a half-rate clock signal and that includes a plurality of delay cells configured to generate a plurality of respective delayed clock signals each having a different time delay from one another; and
   a driver module including a plurality of multiplexers each being in electrical communication with a respective data cell to receive a corresponding delayed clock signal, the plurality of multiplexers configured to output a respective full-rate data stream in response to the delayed clock signal,
   the driver module further including an output stage circuit in electrical communication with each multiplexer to combine each full-rate data stream and to generate a final step-wise driving signal that controls the slew rate.

2. The slew rate control circuit of claim 1, further comprising a data re-timing module that receives at least one input data stream and a latest delayed clock signal from among the plurality of delayed clock signals, the data re-timing module configured to re-time the at least one input data stream based on the latest delayed clock signal.

3. The slew rate control circuit of claim 2, wherein the at least one input data stream includes a first data stream and a second data stream different from the first data stream.

4. The slew rate control circuit of claim 3, wherein the data re-timing module includes a half-rate data re-timing module that receives the first and second data signals and the half-rate clock signal, and a data resampling module is configured to extend the timing of the first and second data streams.

5. The slew rate control circuit of claim 4, wherein the plurality of multiplexers includes a pull-up multiplexer to convert the first data signal into a first full-stream data signal, and a pull-down multiplexer to convert the second data signal into a second full-stream data signal.

6. The slew rate control circuit of claim 5, wherein the driver module further comprises a pull-up circuit in electrical communication with a pull-down circuit, each of the pull-up and pull-down circuits configured to receive the first full-rate data stream the second full-rate data stream, respectively, to generate the final step-wise driving signal.

7. The slew rate control circuit of claim 2, wherein each delay cell among the plurality of delay cells includes a delay stage that applies a unit of delay to the half-rate clock signal.

8. The slew rate control circuit of claim 7, wherein each delay stage applies a different unit of delay to the half-rate clock signal.

9. The slew rate control circuit of claim 8, wherein the value of the weighted delay is based on a binary value assigned to the respective delay cell.

10. The slew rate control circuit of claim 9, wherein the a data resampling module receives a latest delayed clock signal output from a delay stage assigned the greatest binary value among the plurality of delay stages, and re-times the first and second data streams based on the latest delayed clock signal.

11. The slew rate control circuit of claim 2, further comprising a bypass switch to select first and second clock signal paths, the first clock signal path in electrical communication with the plurality of delay cells to deliver the half-rate clock signal thereto and the second clock signal path disconnected from the plurality of data cells and directly connected to the driver module.

* * * * *